United States Patent
Kim et al.

(10) Patent No.: US 11,189,639 B2
(45) Date of Patent: Nov. 30, 2021

(54) INTEGRATED CIRCUIT INCLUDING INTERCONNECTION AND METHOD OF FABRICATING THE SAME, THE INTERCONNECTION INCLUDING A PATTERN SHAPED FOR MITIGATING ELECTROMIGRATION

(71) Applicant: SAMSUNG ELECTRONICS CO., LTD., Suwon-si (KR)

(72) Inventors: Ha-young Kim, Seoul (KR);
Chang-beom Kim, Tongyeong-si (KR);
Hyun-jeong Roh, Suwon-si (KR);
Tae-joong Song, Seongnam-si (KR);
Dal-hee Lee, Seoul (KR); Sung-we Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/842,867

(22) Filed: Apr. 8, 2020

(65) Prior Publication Data
US 2020/0235126 A1 Jul. 23, 2020

Related U.S. Application Data

(63) Continuation of application No. 15/913,530, filed on Mar. 6, 2018, now Pat. No. 10,651,201.

(30) Foreign Application Priority Data

Apr. 5, 2017 (KR) .................. 10-2017-0044396
Aug. 16, 2017 (KR) .................. 10-2017-0103714

(51) Int. Cl.
*H01L 27/118* (2006.01)
*H01L 27/02* (2006.01)

(52) U.S. Cl.
CPC .... *H01L 27/11807* (2013.01); *H01L 27/0207* (2013.01); *H01L 2027/11861* (2013.01); *H01L 2027/11864* (2013.01); *H01L 2027/11875* (2013.01); *H01L 2027/11881* (2013.01); *H01L 2027/11885* (2013.01)

(58) Field of Classification Search
CPC ....... H01L 23/5226; H01L 2027/11885; H01L 2027/11861; H01L 2027/11864; H01L 2027/11881; H01L 2027/11875; H01L 21/823807; H01L 21/823871;
(Continued)

(56) References Cited

U.S. PATENT DOCUMENTS 5,581,475 A 12/1996 Majors
6,380,727 B1 4/2002 Jitaru
(Continued)

*Primary Examiner* — Helen Rossoshek
(74) *Attorney, Agent, or Firm* — Sughrue Mion, PLLC

(57) ABSTRACT

An integrated circuit includes a first conductive pattern in a first conductive layer, a second conductive pattern in a second conductive layer over the first conductive layer, and a via electrically connected with the first conductive pattern and the second conductive pattern to allow a first current flowing from the first conductive pattern to the second conductive pattern and a second current flowing from the second conductive pattern to the first conductive pattern to pass through at different times. The via is placed on the first conductive pattern so that a path of the first current does not overlap with a path of the second current in the first conductive pattern.

18 Claims, 16 Drawing Sheets

(58) Field of Classification Search
CPC ............. H01L 27/0203; H01L 27/0207; H01L 27/11807; H01L 29/0673; H01L 29/0676
See application file for complete search history.

(56) References Cited

U.S. PATENT DOCUMENTS

| | | | |
|---|---|---|---|
| 6,556,101 B1 | 4/2003 | Tada | |
| 6,581,201 B2 | 6/2003 | Cano | |
| 7,047,514 B2* | 5/2006 | Mizuno | H01L 27/118 |
| | | | 257/E27.105 |
| 7,176,574 B2 | 2/2007 | Yu et al. | |
| 8,056,039 B2 | 11/2011 | Chanda et al. | |
| 8,319,348 B2 | 11/2012 | Lee et al. | |
| 8,810,309 B2 | 8/2014 | Lee | |
| 9,035,361 B2 | 5/2015 | Lu | |
| 9,208,277 B1 | 12/2015 | Lamant | |
| 9,454,633 B2 | 9/2016 | Frederick, Jr. | |
| 9,455,220 B2 | 9/2016 | Shroff et al. | |
| 9,490,323 B2* | 11/2016 | Rodder | H01L 29/1037 |
| 9,520,458 B2* | 12/2016 | Kang | H01L 27/0629 |
| 9,543,306 B1 | 1/2017 | Lee | |
| 9,665,680 B2 | 5/2017 | Sapatnekar | |
| 9,728,604 B2* | 8/2017 | Kim | H01L 23/53295 |
| 9,741,661 B2* | 8/2017 | Azmat | H01L 29/0653 |
| 9,761,572 B2* | 9/2017 | Chen | H01L 27/1104 |
| 9,812,450 B2* | 11/2017 | Baek | H01L 27/0886 |
| 9,984,886 B2* | 5/2018 | Kim | H01L 29/41791 |
| 10,217,820 B2* | 2/2019 | Kim | H01L 23/53295 |
| 10,700,164 B2* | 6/2020 | Kim | H01L 21/76862 |
| 10,714,472 B2* | 7/2020 | Kwon | H01L 27/0886 |
| 2004/0155316 A1 | 8/2004 | Saito | |
| 2006/0168551 A1 | 7/2006 | Mukuno | |
| 2007/0001197 A1 | 1/2007 | Ishikura | |
| 2007/0081108 A1* | 4/2007 | Tsukada | G02F 1/136259 |
| | | | 349/54 |
| 2015/0347665 A1 | 12/2015 | Sapatnekar et al. | |
| 2016/0027691 A1 | 1/2016 | Liu | |
| 2016/0056081 A1* | 2/2016 | Baek | H01L 21/823481 |
| | | | 438/283 |
| 2016/0372477 A1 | 12/2016 | Funane | |
| 2017/0256558 A1* | 9/2017 | Zhang | H01L 27/1207 |
| 2018/0040695 A1* | 2/2018 | Smith | H01L 29/0676 |
| 2018/0150589 A1 | 5/2018 | Yang | |
| 2018/0151496 A1 | 5/2018 | Biswas | |
| 2020/0058586 A1* | 2/2020 | Guo | G06F 30/392 |
| 2020/0066711 A1* | 2/2020 | Anderson | H01L 29/7827 |
| 2020/0090944 A1* | 3/2020 | Lee | H01L 21/02063 |
| 2020/0373301 A1* | 11/2020 | Kim | H01L 21/823814 |
| 2021/0020603 A1* | 1/2021 | Nakamura | H01L 23/49833 |
| 2021/0066231 A1* | 3/2021 | Cho | H01L 24/20 |

\* cited by examiner

INTEGRATED CIRCUIT INCLUDING INTERCONNECTION AND METHOD OF FABRICATING THE SAME, THE INTERCONNECTION INCLUDING A PATTERN SHAPED FOR MITIGATING ELECTROMIGRATION

CROSS-REFERENCE TO RELATED APPLICATIONS

This application is a continuation application of U.S. patent Ser. No. 15/913,530, filed on Mar. 6, 2018, which claims priorities from Korean Patent Application Nos. 10-2017-0044396, filed on Apr. 5, 2017, and 10-2017-0103714, filed on Aug. 16, 2017, in the Korean Intellectual Property Office, the disclosures of which are incorporated herein in their entireties by reference.

BACKGROUND

Apparatuses and methods consistent with one or more exemplary embodiments relate to an integrated circuit, and more particularly, to an integrated circuit including interconnection for mitigating electromigration and a method of fabricating the same.

Electromigration may refer to the motion of atoms of a conductive material such as a metal, which occurs when current flows through the conductive material. As current density increases, electromigration also increases and, even more, a pattern formed of the conductive material may break due to the motion of atoms. Electromigration may affect the functions of an integrated circuit, which includes a plurality of patterns formed of conductive material, and a semiconductor device including the integrated circuit. Additionally, electromigration may affect the durability of the integrated circuit and the semiconductor device. Since the size of patterns decreases as the degree of integration increases in integrated circuits, designing the integrated circuits taking electromigration into account is increasingly significant.

SUMMARY

Aspects of one or more exemplary embodiments provide an integrated circuit including interconnection for preventing and/or mitigating electromigration, taking a current path in a conductive pattern into account, and a method of fabricating the same.

According to an aspect of an exemplary embodiment, there is provided an integrated circuit including: a first conductive pattern in a first conductive layer, the first conductive pattern including: a first segment including at least one first point through which a first current is supplied from outside the first conductive pattern, a second segment including at least one second point through which a second current is drawn to outside the first conductive pattern, and a third segment connecting the first segment to the second segment; a second conductive pattern in a second conductive layer over the first conductive layer; and a via electrically connected with the first conductive pattern and the second conductive pattern to allow the first current to be supplied through the via to the second conductive pattern and to allow the second current to be drawn from the second conductive pattern through the via, the via being on the third segment of the first conductive pattern.

According to an aspect of another exemplary embodiment, there is provided an integrated circuit including: a first conductive pattern in a first conductive layer; a second conductive pattern in a second conductive layer over the first conductive layer; and a via electrically connected with the first conductive pattern and the second conductive pattern to allow a first current flowing from the first conductive pattern to the second conductive pattern to pass through and to allow a second current flowing from the second conductive pattern to the first conductive pattern to pass through, wherein the via is on the first conductive pattern so that a path of the first current does not overlap with a path of the second current in the first conductive pattern.

According to an aspect of another exemplary embodiment, there is provided a method of fabricating an integrated circuit including a plurality of standard cells, the method including: performing routing by creating, with reference to a cell library, a plurality of interconnections connecting input pins and output pins of the plurality of standard cells; and generating layout data defining the plurality of interconnections, wherein the performing the routing includes placing a via included in the plurality of interconnections on a third region between a first region of a conductive pattern and a second region of the conductive pattern, wherein the conductive pattern corresponds to an output pin of at least one of the plurality of standard cells, wherein the first region includes at least one first point through which a current is supplied from outside the conductive pattern, and wherein the second region includes at least one second point through which a current is drawn to outside the conductive pattern.

According to an aspect of another exemplary embodiment, there is provided a conductive layer of an integrated circuit, the conductive layer including: a first segment of a conductive pattern, the first segment including at least one first point through which a first current is supplied from outside of the conductive pattern; a second segment of the conductive pattern, the second segment including at least one second point through which a second current is drawn to outside the conductive pattern, and a third segment connecting the first segment to the second segment, and electrically connected to a via through which the first current passes to another conductive pattern and the second current passes from the other conductive pattern, wherein the via is on the conductive pattern so that a path of the first current does not overlap with a path of the second current in the conductive pattern.

BRIEF DESCRIPTION OF THE DRAWINGS

Exemplary embodiments will be more clearly understood from the following detailed description taken in conjunction with the accompanying drawings in which.

DETAILED DESCRIPTION OF EXEMPLARY EMBODIMENTS

Below, exemplary embodiments will be described in detail and clearly to such an extent that one of ordinary skill in the art can implement an inventive concept without undue burden or experimentation. Further, it is understood that expressions such as "at least one of," when preceding a list of elements, modify the entire list of elements and do not modify the individual elements of the list.

Figure 1:
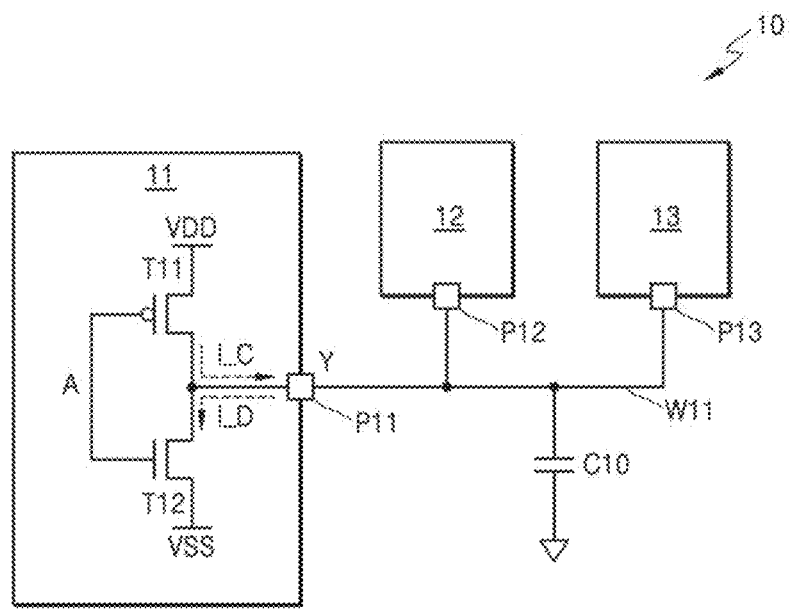
FIG. 1 is a circuit diagram of part of an integrated circuit according to an exemplary embodiment.

FIG. 1 is a circuit diagram of part of an integrated circuit 10 according to an exemplary embodiment. As shown in FIG. 1, the integrated circuit 10 may include a plurality of standard cells, i.e., first through third standard cells 11, 12, and 13.

A standard cell is a layout unit included in the integrated circuit 10. The integrated circuit 10 may include a plurality of various standard cells. A standard cell may have a structure complying with predetermined specifications. For example, a standard cell may have a layout with a fixed height and a variable width, as described below with reference to FIG. 2A. A standard cell may include at least one input pin receiving an input signal and at least one output pin outputting an output signal. Additionally, the standard cell may generate an output signal depending on an input signal. A standard cell library may define a plurality of standard cells. In designing the integrated circuit 10, a plurality of standard cells may be placed with reference to the standard cell library.

Referring to FIG. 1, an output signal Y of the first standard cell 11 may be output through an output pin P11 of the first standard cell 11 and may be provided to input pins P12 and P13 of the second standard cell 12 and the third standard cell 13, respectively. An interconnection W11 connects the output pin P11 of the first standard cell 11 with the input pins P12 and P13 of the second standard cell 12 and the third standard cell 13. The interconnection W11 may include a parasitic capacitor C10. The interconnection W11 may include at least one via and a pattern formed in at least one conductive layer in the layout of the integrated circuit 10. The via and the conductive pattern may each have parasitic capacitance.

The first standard cell 11 may include a p-type metal-oxide-semiconductor (PMOS) transistor T11 and an n-type MOS (NMOS) transistor T12, which drive the output signal Y according to an internal signal A. When the internal signal A is at a low level in the first standard cell 11, the PMOS transistor T11 may be turned on and the NMOS transistor T12 may be turned off. Accordingly, a current I_C may flow from a power supply voltage VDD to the output pin P11 and may charge the parasitic capacitor C10. As a result, the output signal Y may be at a high level. When the internal signal A is at a high level in the first standard cell 11, the NMOS transistor T12 may be turned on and the PMOS transistor T11 may be turned off. Accordingly, a current I_D may flow to a ground voltage VSS through the output pin P11 and may discharge the parasitic capacitor C10. As a result, the output signal Y may be at a low level. As described above, a flow of current may be generated by an element, i.e., the PMOS transistor T11, which supplies current according to signal level transition in the first standard cell 11 and an element, i.e., the NMOS transistor T12, which draws current according to the signal level transition in the first standard cell 11. In exemplary embodiments described below, the current I_C may be referred to as a charging output current and the current I_D may be referred to as a discharging output current.

A path through which the current I_C supplied by the PMOS transistor T11 flows in the first standard cell 11 may at least partially include a section in which at least some of the current I_C flows in one direction. Similarly, a path through which the current I_D drawn by the NMOS transistor T12 flows in the first standard cell 11 may at least partially include a section in which at least some of the current I_D flows in one direction. Accordingly, electromigration (EM) may occur in the first standard cell 11, and more particularly, signal EM may occur due to a signal having level transition. EM may be partially reduced by expanding the cross sectional area of the path of current. However, it may be restrictive to expand the cross sectional area of an interconnection, and more particularly, of a conductive pattern included in the interconnection, in which current flows, in the first standard cell 11 with a limited area.

As described below, according to exemplary embodiments, the placement of a via connected to the output pin P11 of the first standard cell 11 and included in the interconnection W11 may be limited, the paths of the currents I_C and I_D may be determined depending on the placement of the via, and EM may be prevented and/or mitigated in the limited space of the first standard cell 11. In addition, the shape of the output pin P11 may be changed according to the paths of the currents I_C and I_D. The unnecessary area of the output pin P11 for the prevention and/or mitigation of EM is reduced, so that the spatial efficiency of the first standard cell 11 can be increased and the capacitance of the output pin P11 can be decreased. As a result, the design freedom and timing characteristics of the integrated circuit 10 are improved, so that the performance of the integrated circuit 10 can be improved.

Figure 2A:
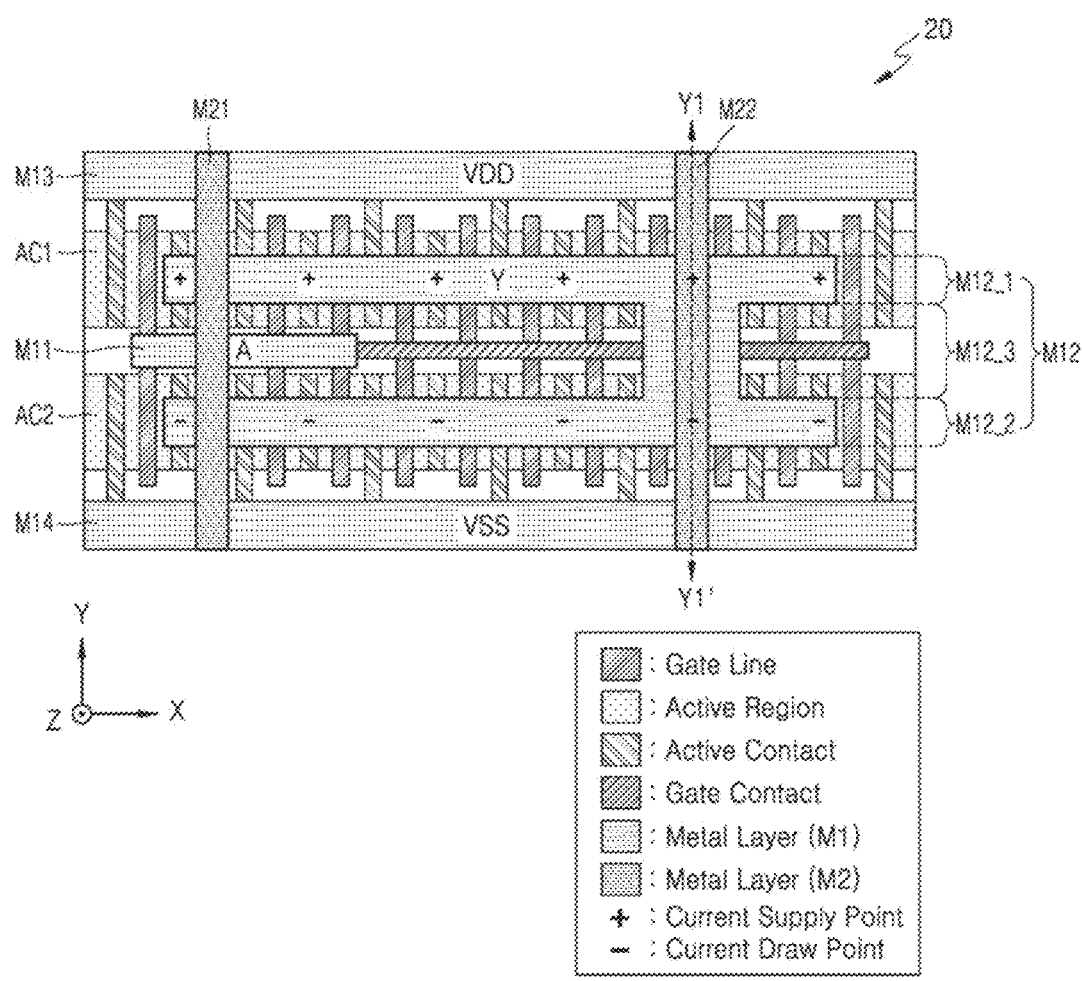
FIG. 2A is a diagram of the layout of a standard cell according to an exemplary embodiment.
Figure 2B:
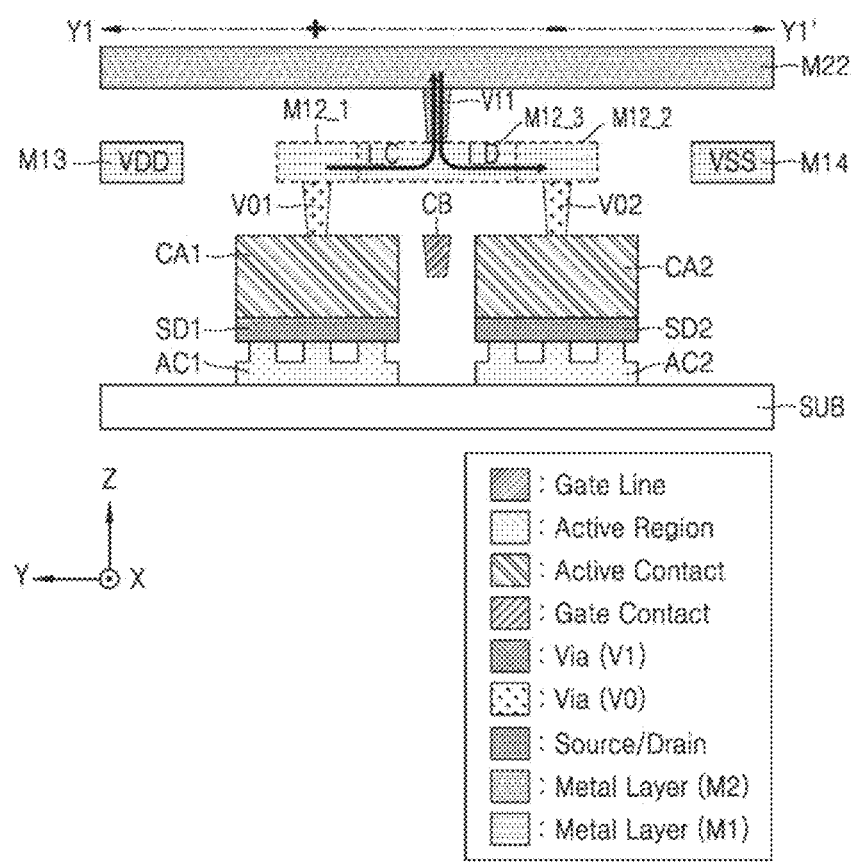
FIG. 2B is a cross-sectional view of the standard cell, taken along the line Y1-Y1' shown in FIG. 2A, according to an exemplary embodiment.

FIG. 2A is a diagram of the layout of a standard cell 20 included in an integrated circuit, according to an exemplary embodiment. FIG. 2B is a cross-sectional view of the standard cell 20, taken along the line Y1-Y1' shown in FIG. 2A, according to an exemplary embodiment. In detail, FIG. 2A is a plan view of the standard cell 20 corresponding to an inverter having the input signal A and the output signal Y and conductive patterns M21 and M22 placed to route the input signal A and the output signal Y of the inverter in a plane formed of an X-axis and a Y-axis. FIG. 2B is a cross-sectional view of the standard cell 20 and the conductive pattern M22, taken along the line Y1-Y1' shown in FIG.

2A in parallel with a Z-axis. Hereinafter, a plane formed of the X-axis and the Y-axis may be referred to as a horizontal plane; elements placed in a +Z direction as compared with other elements may be construed as being on or above the other elements; and elements placed in a −Z direction as compared with other elements may be construed as being below or under the other elements. Surfaces of elements in the +Z direction may be referred to as top surfaces of the elements. Surfaces of elements in the −Z direction may be referred to as bottom surfaces of the elements. Surfaces of elements in the X-axis or the Y-axis direction may be referred to as side surfaces of the elements.

As described above with reference to FIG. 1, the standard cell 20 may have a structure complying with predetermined standards. Referring to FIG. 2A, the standard cell 20 may have a predetermined height, i.e., a length in the Y-axis direction, and may include gate lines and active regions placed therein according to predetermined rules. Another standard cell included in an integrated circuit may have a width, i.e., a length in the X-axis direction, different than that shown in FIG. 2A and may include a different number of gate lines.

Referring to FIGS. 2A and 2B, a first active region AC1 and a second active region AC2 may be extended in the X-axis direction on a substrate SUB having a surface parallel with a horizontal plane. The first active region AC1 and the second active region AC2 may include a semiconductor, such as Silicon (Si) or Germanium (Ge), or a compound semiconductor, such as Silicon-Germanium (SiGe), Silicon Carbide (SiC), Gallium Arsenide (GaAs), Indium Arsenide (InAs), Indium Phosphide (InP), etc. The first active region AC1 and the second active region AC2 may include a conductive region such as an impurity-doped well or an impurity-doped structure. Gage lines may be extended on the first active region AC1 and the second active region AC2 in the Y-axis direction. Source/drains regions (e.g., SD1 and SD2 in FIG. 2B) may be formed at one side of each gate line on the first active region AC1 and the second active region AC2. The first active region AC1 may form a PMOS transistor together with each gate line and the second active region AC2 may form an NMOS transistor together with each gate line.

In some exemplary embodiments, a transistor formed with the first active region AC1 and the second active region AC2 and gate lines may be a fin field effect transistor (FinFET). For example, as shown in FIG. 2B, the first active region AC1 and the second active region AC2 may include at least one fin which protrudes and extends in a Z-axis direction and a gate line may control a channel of a transistor through the top surface of the fin and side surfaces thereof, i.e., side surfaces facing in the Y-axis direction. Although each of the first active region AC1 and the second active region AC2 includes three fins in the exemplary embodiment illustrated in FIG. 2B, each active region AC1 or AC2 may include, for example, at most two or at least four fins in one or more other exemplary embodiments. The source/drain regions SD1 and SD2 formed on a plurality of fins may be discontinuously formed on the fins differently than shown in FIG. 2B.

Conductive patterns M12 through M14 may be formed on a conductive layer separately placed above gate lines. The conductive patterns M12 through M14 may be referred to as local interconnects and may electrically interconnect vias (e.g., V01 and V02 in FIG. 2B) placed at different positions. The conductive patterns M12 through M14 may be electrically connected with one another through a via (e.g., V11 in FIG. 2B) and a pattern (e.g., M22 in FIG. 2B or second conductive pattern) above the conductive patterns M12 through M14. Similarly, as shown in FIG. 2A, a source of a transistor may be electrically connected with the conductive pattern M13 or M14, which supplies the power supply voltage VDD or the ground voltage VSS, through a gate contact extending in the Y-axis direction and a via placed on the gate contact. As shown in FIG. 2A, the standard cell 20 may include an input pin M11 to which the input signal A is applied and an output pin M12 outputting the output signal Y, e.g., an inverted signal of the input signal A. The input signal A transmitted from the conductive pattern M21 of a metal layer M2 to the input pin M11 through a via may be transmitted to a plurality of gate lines through a gate contact CB. The output signal Y may be output from the output pin M12 (e.g., first conductive pattern) to the conductive pattern M22 (e.g., second conductive pattern) of the metal layer M2 through the via V11. Positions of vias (e.g., V11) connected among the conductive patterns M21 and M22 and the input pin M11 and the output pin M12 may be determined in a stage of routing standard cells that have been placed during the design of an integrated circuit. In other words, V1 vias may not be included in the standard cell 20 but may be added in a routing stage after the standard cell 20 is placed. The input pin M11 and the output pin M12 are shown as patterns formed on a metal layer M1 in the standard cell 20 in the exemplary embodiment illustrated in FIG. 2A. However, it is understood that one or more other exemplary embodiments are not limited thereto. For example, according to another exemplary embodiment, the standard cell 20 may include a pattern formed on the metal layer M2, i.e., an upper routing layer of the metal layer M1, and an input pin and/or an output pin may be the pattern formed on the metal layer M2.

The level, i.e., the voltage, of the output signal Y may be determined by a current supplied from the inside of the standard cell 20 to the output pin M12 or a current drawn from the output pin M12 to the inside of the standard cell 20, as described above with reference to FIG. 1. Referring to FIG. 2A, for example, PMOS transistors formed in the first active region AC1 may supply a current to the output pin M12 and NMOS transistors formed in the second active region AC2 may draw a current from the output pin M12. The output pin M12 may be connected with the PMOS transistors through active contacts (e.g., CA1 in FIG. 2B) and a point connected with any one of the active contacts may be marked with "+" in FIG. 2A and may be referred to as a current supply point. The output pin M12 may be connected with the NMOS transistors through active contacts (e.g., CA2 in FIG. 2B) and a point connected with any one of the active contacts may be marked with "−" in FIG. 2A and may be referred to as a current draw point. As described above with reference to FIG. 1, the current I_C supplied from current supply points and the current I_D drawn from current draw points may be generated at different times.

The shape of the output pin M12 may be determined taking the currents I_C and I_D into account. For example, the output pin M12 may have a large cross-sectional area at a segment where current density is high in order to reduce the EM influence. In other words, when a length of the output pin M12 in a direction crossing a direction in which a current flows is referred to as a width of the output pin M12, the output pin M12 may have a relatively wide width at a segment having a relatively high current density. However, the limited size of the standard cell 20 may result in a limit to the area of the horizontal plane of the output pin M12. As described below, when the position of the via V11 placed in the output pin M12 is limited, EM may be mitigated without an increase in the area of the output pin M12.

As shown in FIG. 2A, the output pin M12 may include a first segment M12_1 including current supply points and extending in the X-axis direction, a second segment M12_2 including current draw points and extending in the X-axis direction, and a third segment M12_3 connecting between the first segment M12_1 and the second segment M12_2. The via V11, which is electrically connected with the output pin M12 and outputs the output signal Y to the outside of the standard cell 20, may be placed on the third segment M12_3 of the output pin M12. In other words, the via V11 may be placed on the output pin M12 between a current supply point and a current draw point. Therefore, a path of the current I_C flowing from the current supply points to the via V11 may not overlap with a path of the current I_D flowing from the via V11 to the current draw points in the output pin M12.

As the via V11 is placed at the third segment M12_3 of the output pin M12, the third segment M12_3 of the output pin M12 may have a relatively wide with (i.e., length in the X-axis direction) for the current I_C flowing from the current supply points and the current I_D drawn to the current draw points and the first segment M12_1 and the second segment M12_2 of the output pin M12 may have a relatively narrow width (i.e., length in the Y-axis direction). Since the standard cell 20 has a predetermined height (i.e., length in the Y-axis direction), the relatively reduced Y-axis direction length of the first and second segments M12_1 and M12_2 of the output pin M12 extending in the X-axis direction may increase the spatial efficiency of the standard cell 20. In other words, while the expansion of the width (i.e., Y-axis direction length) of the first segment M12_1 and the second segment M12_2 of the output pin M12 for EM may be limited in the standard cell 20 having a predetermined height, the paths of the currents I_C and I_D are determined by the via V11 placed at the third segment M12_3 of the output pin M12, as shown in FIG. 2A. Therefore, only the width (i.e., X-axis direction length) of the third segment M12_3 of the output pin M12 may be expanded.

Figure 3:
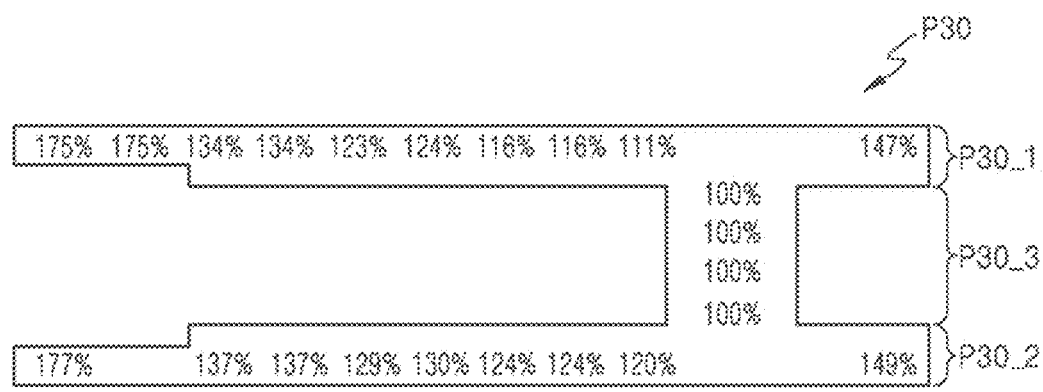
FIG. 3 is a schematic diagram of the effect of electromigration depending on the placement of a via in an output pin of a standard cell, according to an exemplary embodiment.

FIG. 3 is a schematic diagram of the effect of EM depending on the placement of a via in an output pin P30 of a standard cell, according to an exemplary embodiment.

Referring to FIG. 3, a first segment P30_1 of the output pin P30, which includes current supply points and extends in the X-axis direction, and a second segment P30_2 of the output pin P30, which includes current draw points and extends in the X-axis direction, have a relatively narrow width (i.e., Y-axis direction length) due to the limited space of the standard cell. Meanwhile, a third segment P30_3 connecting between the first segment P30_1 and the second segment P30_2 may have a relatively wide width (i.e., X-axis direction length).

A current density per unit area allowed for prevention and/or mitigation of EM may be defined according to semiconductor processes for fabricating an integrated circuit and/or a material of a conductive pattern. For example, since a vertical length of a conductive pattern formed on a conductive layer is substantially constant, the conductive layer may have a current density per unit width allowed for prevention and/or mitigation of EM. FIG. 3 shows percentages of the current density per unit width with respect to the placement of a via electrically connected with the output pin P30 when the limit of the current density per unit width of the output pin P30 is 100%.

As shown in FIG. 3, when a via is placed at the first segment P30_1 or the second segment P30_2 of the output pin P30, the current density per unit width may exceed the limit. When a via is placed at the third segment P30_3 of the output pin P30, the current density per unit width may conform to the limit. This is because the third segment P30_3 of the output pin P30 has a relatively wide width (i.e., X-axis direction length) and a path of a current (e.g., I_C in FIG. 2B) supplied from current supply points does not overlap with a path of a current (e.g., I_D in FIG. 2B) drawn to current draw points. For example, when a via is placed at the first segment P30_1 of the output pin P30, a current supplied from the current supply points may flow from the right and left sides of the via toward the via while a current drawn to the current draw points may flow from one side (e.g., +X-axis direction) of the via. Therefore, the width of the first segment P30_1 of the output pin P30 may be wide. Accordingly, when the via is placed at a segment allowed to have a relatively wide width between the current supply points and the current draw points, the path of the current supplied from the current supply points may not overlap with the path of the current drawn to the current draw points in the output pin P30.

Figure 4A:
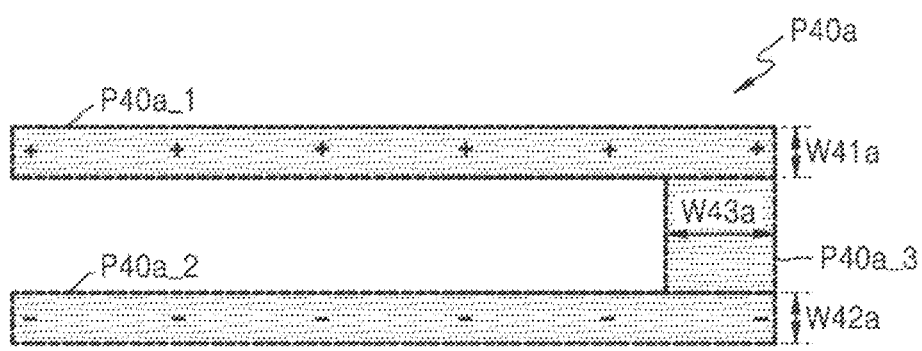
FIGS. 4A through 4C are diagrams of a segment at which a via is placed in a conductive pattern, according to one or more exemplary embodiments.
Figure 4B:
Figure 4C:
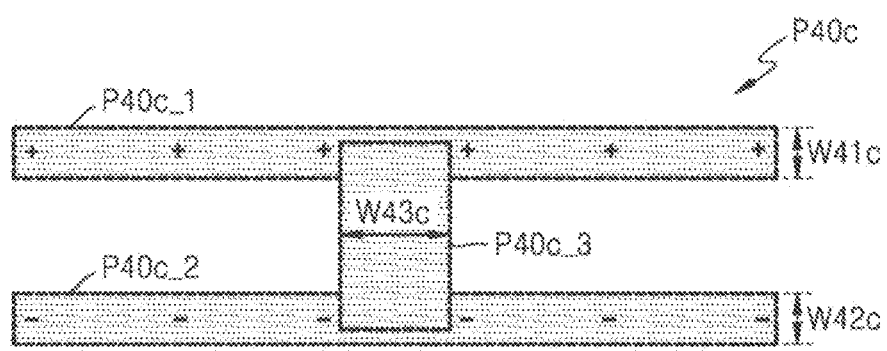

FIGS. 4A through 4C are diagrams of a segment at which a via is placed in a conductive pattern, according to one or more exemplary embodiments. As described above with reference to FIGS. 2A and 2B, a via in a conductive pattern may be placed at a segment connecting a segment including current supply points with a segment including current draw points. Although output pins of a standard cell are illustrated as examples of a conductive pattern in FIGS. 4A through 4C, it is understood that one or more other exemplary embodiments are not limited thereto. That is, it is understood that one or more other exemplary embodiments can be applied to a different conductive pattern, e.g., a conductive pattern corresponding to an internal signal of the standard cell.

Referring to FIG. 4A, an output pin P40a may have a "U" shape on a horizontal plane and may include a first segment P40a_1 including current supply points and extending in the X-axis direction, a second segment P40a_2 including current draw points and extending in the X-axis direction, and a third segment P40a_3 connecting the first segment P40a_1 to the second segment P40a_2 and extending in the Y-axis direction. The third segment P40a_3 may not include regions adjacent to the first segment P40a_1 and the second segment P40a_2 in the X-axis direction.

A via may be placed on the third segment P40a_3 of the output pin P40a. A path of a current flowing from the current supply points to the via and a path of a current flowing from the via to the current draw points may be determined according to the placement of the via. Since the third segment P40a_3 of the output pin P40a provides a path for a current supplied from any one of the current supply points and a path for a current drawn to any one of the current draw points, a width W43a of the third segment P40a_3 may be greater than a width W41a of the first segment P40a_1 and a width W42a of the second segment P40a_2. As described above with reference to FIG. 2A, securing a region for expanding the third segment P40a_3 in the X-axis direction may be easier than securing a region for expanding the first segment P40a_1 and the second segment P40a_2 in the Y-axis direction in a standard cell.

Referring to FIG. 4B, similarly to the output pin P40a shown in FIG. 4A, an output pin P40b may have a "U" shape on a horizontal plane and may include a first segment P40b_1 including current supply points and extending in the X-axis direction, a second segment P40b_2 including current draw points and extending in the X-axis direction, and a third segment P40$b$_3 connecting the first segment P40$b$_1 to the second segment P40$b$_2. As shown in FIG. 4B, the third segment P40$b$_3 may include at least one current supply point and/or at least one current draw point. Though a via is placed on the third segment P40$b$_3 including at least one current supply point and/or at least one current draw point, a path of a current flowing from current supply points to the via may not overlap with a path of a current flowing from the via to current draw points. A width W43$b$ of the third segment P40$b$_3 on which the via may be placed may be greater than a width W41$b$ of the first segment P40$b$_1 and a width W42$b$ of the second segment P40$b$_2.

Referring to FIG. 4C, an output pin P40$c$ may have an "H" shape on a horizontal plane and may include a first segment P40$c$_1 including current supply points and extending in the X-axis direction, a second segment P40$c$_2 including current draw points and extending in the X-axis direction, and a third segment P40$c$_3 connecting the first segment P40$c$_1 to the second segment P40$c$_2. A width W43$c$ of the third segment P40$c$_3 may be greater than a width W41$c$ of the first segment P40$c$_1 and a width W42$c$ of the second segment P40$c$_2. As shown in FIG. 4C, when the third segment P40$c$_3 is placed in the middle of the first segment P40$c$_1 in the X-axis direction, both parts of the first segment P40$c$_1 separated by the third segment P40$c$_3 in the X-axis direction may have a maximum current density lower than a maximum current density of the first segment P40$a$_1 shown in FIG. 4A. Accordingly, the width W41$c$ of the first segment P40$c$_1 shown in FIG. 4C may be the same as or less than the width W41$a$ of the first segment P40$a$_1 shown in FIG. 4A.

FIGS. 5A through 5E are diagrams of a conductive pattern and a segment at which a via is placed in the conductive pattern, according to one or more exemplary embodiments. Although output pins of a standard cell are illustrated as examples of a conductive pattern in FIGS. 5A through 5E, it is understood that one or more other exemplary embodiments are not limited thereto. That is, it is understood that one or more other exemplary embodiments can be applied to a different conductive pattern, e.g., a conductive pattern corresponding to an internal signal of the standard cell. Redundant descriptions will be omitted below.

Figure 5A:
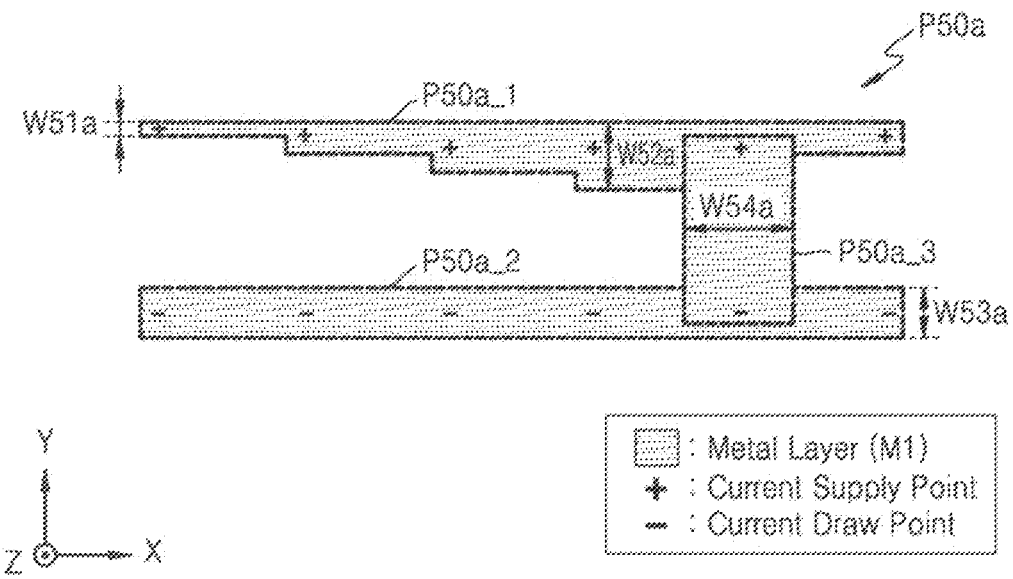
FIGS. 5A through 5E are diagrams of a conductive pattern and a segment at which a via is placed in the conductive pattern, according to one or more exemplary embodiments.

Referring to FIG. 5A, an output pin P50$a$ may include a first segment P50$a$_1 including current supply points and extending in the X-axis direction, a second segment P50$a$_2 including current draw points and extending in the X-axis direction, and a third segment P50$a$_3 connecting the first segment P50$a$_1 to the second segment P50$a$_2. A width W54$a$ of the third segment P50$a$_3 may be greater than a maximum width W52$a$ of the first segment P50$a$_1 and a width W53$a$ of the second segment P50$a$_2.

The first segment P50$a$_1 including current supply points may have a stair shape of which the width (i.e., Y-axis direction length) decreases away from the third segment P50$a$_3 in the X-axis direction. For example, as shown in FIG. 5A, the first segment P50$a$_1 may have the width W52$a$ at a region adjacent to the third segment P50$a$_3 while the first segment P50$a$_1 may have a width W51$a$ at a region farthest from the third segment P50$a$_3, the width W51$a$ being less than the width W52$a$.

A width (i.e., a Y-axis direction length) of the first segment P50$a$_1 may be determined based on the magnitude of a current supplied from each of the current supply points and a current per unit width allowed in the output pin P50$a$. For example, the width W51$a$ of a region of the first segment P50$a$_1 farthest from the third segment P50$a$_3 may be determined based on the magnitude of a current supplied from one current supply point and the current per unit width allowed in the output pin P50$a$. Similarly, the width W52$a$ of the region of the first segment P50$a$_1 adjacent to the third segment P50$a$_3 may be determined based on the magnitude of a current supplied from four current supply points and the current per unit width allowed in the output pin P50$a$.

As the first segment P50$a$_1 has the stair shape, an unnecessary area of the output pin P50$a$ is reduced, and therefore, the spatial efficiency of the standard cell including the output pin P50$a$ is increased. For example, as described below with reference to FIG. 6, the stair shape of the first segment P50$a$_1 may lead to expansion of a space between the first segment P50$a$_1 and the second segment P50$a$_2 and the expanded space may be used to place another element, e.g., an input pin.

Figure 5B:
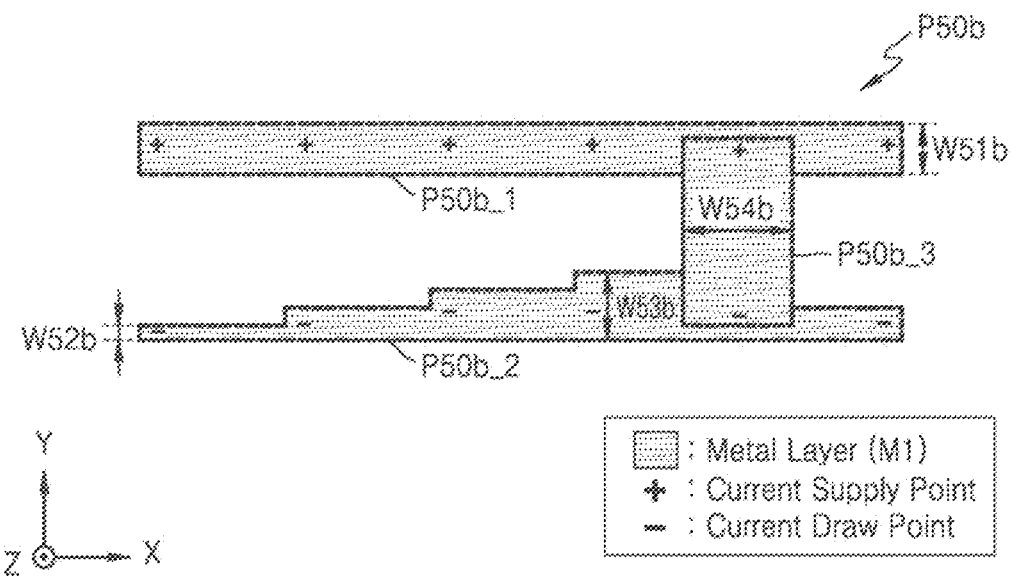

Referring to FIG. 5B, an output pin P50$b$ may include a first segment P50$b$_1 including current supply points and extending in the X-axis direction, a second segment P50$b$_2 including current draw points and extending in the X-axis direction, and a third segment P50$b$_3 connecting the first segment P50$b$_1 to the second segment P50$b$_2. A width W54$b$ of the third segment P50$b$_3 may be greater than a width W51$b$ of the first segment P50$b$_1 and a maximum width W53$b$ of the second segment P50$b$_2.

The second segment P50$b$_2 including current draw points may have a stair shape of which the width (i.e., Y-axis direction length) decreases away from the third segment P50$b$_3 in the X-axis direction. For example, as shown in FIG. 5B, the second segment P50$b$_2 may have the width W53$b$ at a region adjacent to the third segment P50$b$_3 while the second segment P50$b$_2 may have a width W52$b$ at a region farthest from the third segment P50$b$_3, the width W52$b$ being less than the width W53$b$.

A width (i.e., a Y-axis direction length) of the second segment P50$b$_2 may be determined based on the magnitude of a current drawn to each of the current draw points and a current per unit width allowed in the output pin P50$b$. For example, the width W52$b$ of a region of the second segment P50$b$_2 farthest from the third segment P50$b$_3 may be determined based on the magnitude of a current drawn from one current draw point and the current per unit width allowed in the output pin P50$b$. Similarly, the width W53$b$ of the region of the second segment P50$b$_2 adjacent to the third segment P50$b$_3 may be determined based on the magnitude of a current drawn to four current draw points and the current per unit width allowed in the output pin P50$b$.

Similarly to the first segment P50$a$_1 shown in FIG. 5A, as the second segment P50$b$_2 shown in FIG. 5B has the stair shape, an unnecessary area of the output pin P50$b$ is reduced, and therefore, the spatial efficiency of the standard cell including the output pin P50$b$ is increased.

Figure 5C:
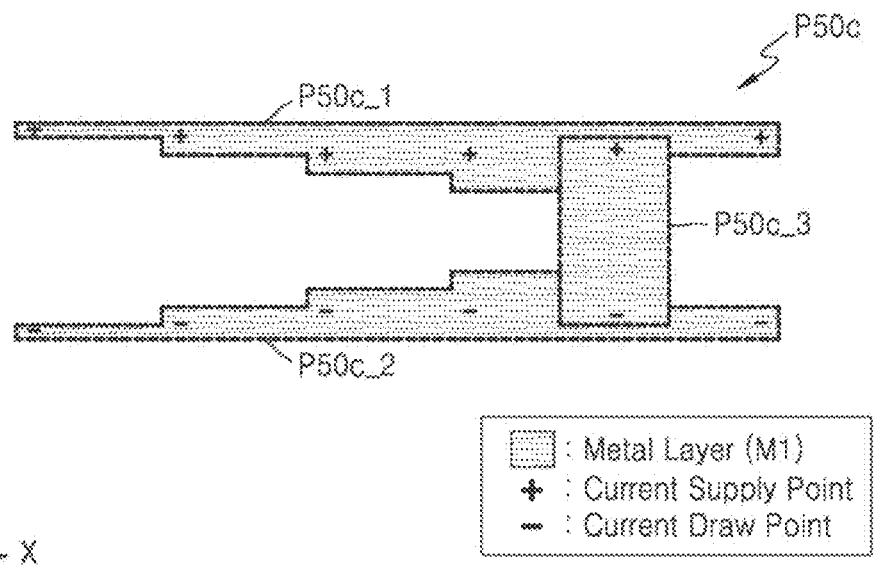

Referring to FIG. 5C, an output pin P50$c$ may include a first segment P50$c$_1 including current supply points and extending in the X-axis direction, a second segment P50$c$_2 including current draw points and extending in the X-axis direction, and a third segment P50$c$_3 connecting the first segment P50$c$_1 to the second segment P50$c$_2. The first segment P50$c$_1 and the second segment P50$c$_2 may have a stair shape of which the width (i.e., Y-axis direction length) decreases away from the third segment P50$c$_3 in the X-axis direction. As described above with reference to FIGS. 5A and 5B, the width of the stair shape may be determined based on the magnitude of a current flowing in a corresponding place and an allowed current per unit width. When both the first segment P50$c$_1 and the second segment P50c_2 have a stair shape, as shown in FIG. 5C, a relatively large space may be secured between the first segment P50c_1 and the second segment P50c_2.

Figure 5D:
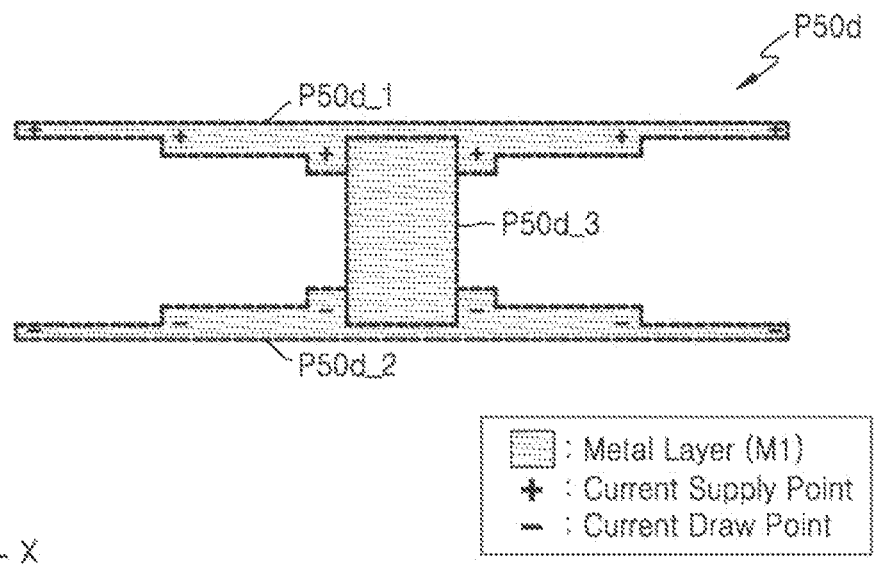

Referring to FIG. 5D, an output pin P50d may include a first segment P50d_1 including current supply points and extending in the X-axis direction, a second segment P50d_2 including current draw points and extending in the X-axis direction, and a third segment P50d_3 connecting the first segment P50d_1 to the second segment P50d_2. The first segment P50d_1 and the second segment P50d_2 may have a stair shape of which the width (i.e., Y-axis direction length) decreases away from the third segment P50d_3 in the X-axis direction. As compared to the output pin P50c shown in FIG. 5C, the first segment P50d_1 and the second segment P50d_2 may have a stair shape of which the width (i.e., Y-axis direction length) decreases away from the third segment P50d_3 in the middle in opposite directions along the X-axis. As described above with reference to FIGS. 5A and 5B, the width of the stair shape may be determined based on the magnitude of a current flowing in a corresponding place and an allowed current per unit width. In the output pins P50c and P50d shown in FIGS. 5C and 5D, the stair shape may vary with the position of the third segment P50c_3 or P50d_3.

Figure 5E:
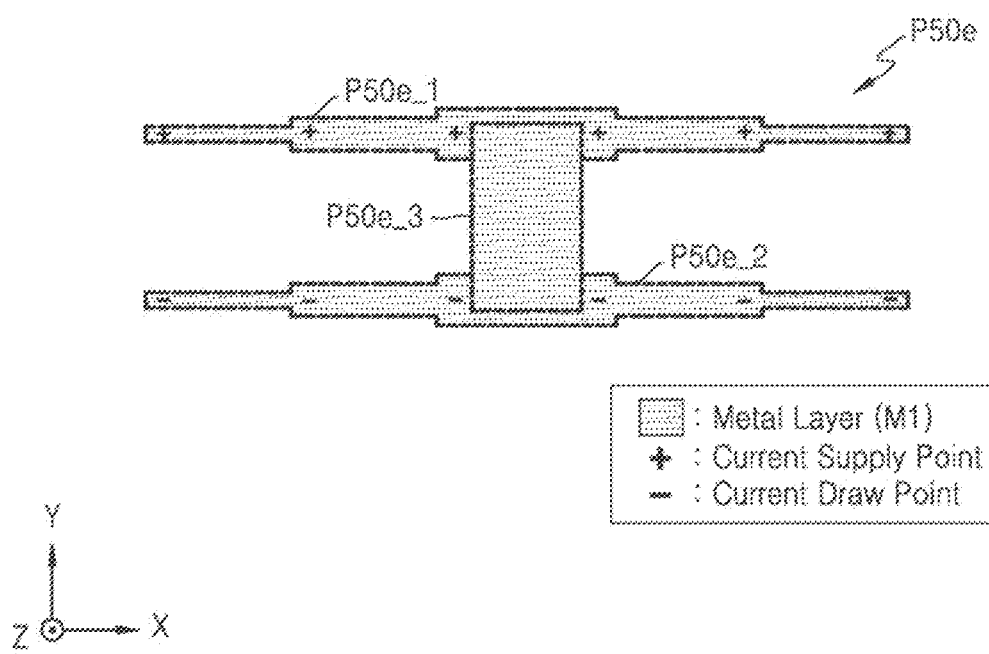

Referring to FIG. 5E, an output pin P50e may include a first segment P50e_1 including current supply points and extending in the X-axis direction, a second segment P50e_2 including current draw points and extending in the X-axis direction, and a third segment P50e_3 connecting the first segment P50e_1 to the second segment P50e_2. The first segment P50e_1 and the second segment P50e_2 may have a stair shape of which the width (i.e., Y-axis direction length) decreases away from the third segment P50e_3 in the X-axis direction. As compared to the output pin P50d shown in FIG. 5D, each of the first segment P50e_1 and the second segment P50e_2 shown in FIG. 5E may have stair shapes at both sides, respectively, facing each other in the Y-axis direction.

The stair shapes described above with reference to FIGS. 5A through 5E are just examples. It is understood that in various exemplary embodiments, a first segment and/or a second segment of an output pin may have any shape of which the width decreases away from a third segment. For example, the first segment and/or the second segment may have a ramp shape of which the width gradually decreases away from the third segment or may have a hybrid shape combining a ramp shape and a stair shape.

Figure 6:
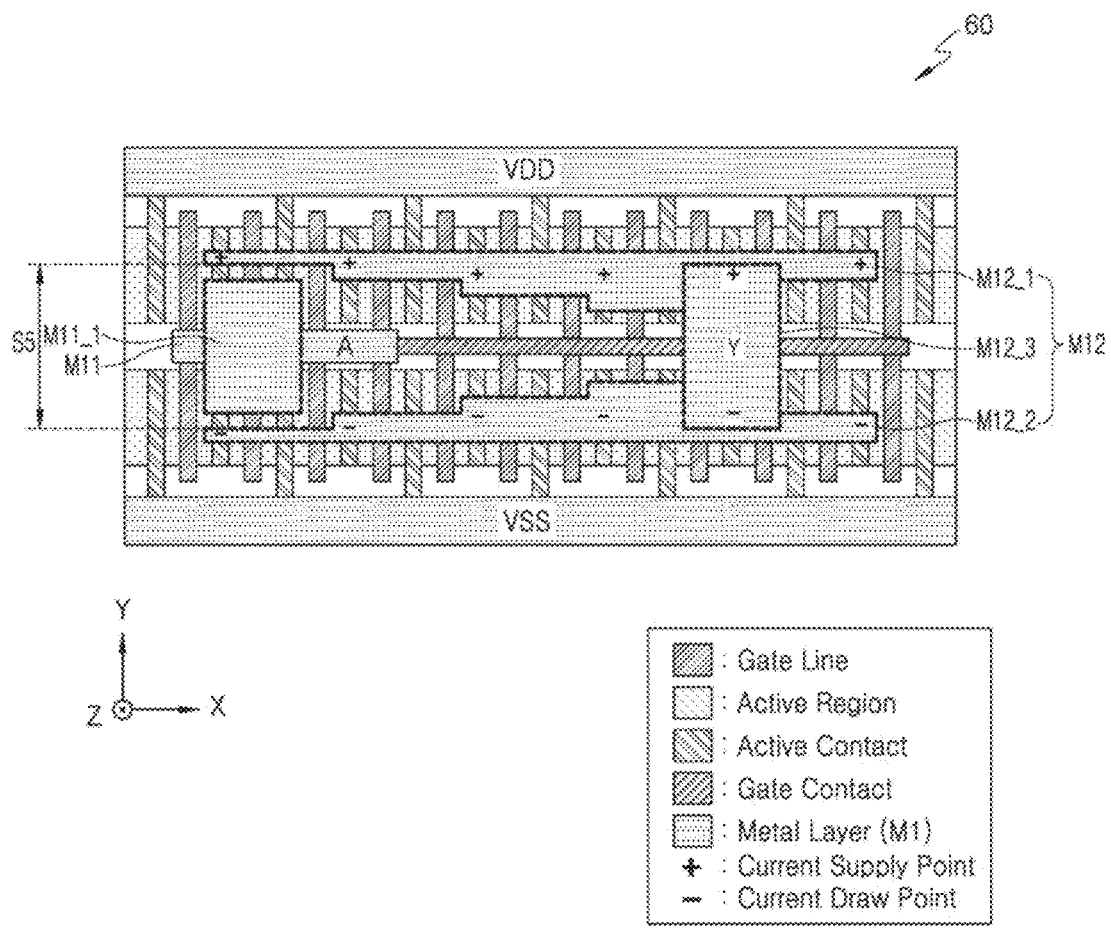
FIG. 6 is a diagram of the layout of a standard cell according to another exemplary embodiment.

FIG. 6 is a diagram of the layout of a standard cell 60 according to another exemplary embodiment. In detail, FIG. 6 is a plan view of the layout of the standard cell 60 corresponding to an inverter, which receives the input signal A and outputs the output signal Y, in a plane formed of an X-axis and a Y-axis. The standard cell 60 may include the input pin M11 and the output pin M12. A via may be placed in each of the input pin M11 and the output pin M12.

As described above with reference to, among others, FIG. 2A, the output pin M12 may include the first segment M12_1 including current supply points, the second segment M12_2 including current draw points, and the third segment M12_3 connecting the first segment M12_1 to the second segment M12_2. A via may be placed on the third segment M12_3. The first segment M12_1 and the second segment M12_2 may have a stair shape of which the width (i.e., Y-axis direction length) decreases away from the third segment M12_3. A distance between the first segment M12_1 and the second segment M12_2 may be "S5" at a region farthest from the third segment M12_3.

Due to the stair shape of the first segment M12_1 and/or the second segment M12_2, the spatial efficiency of the metal layer M1 increases. Accordingly, the input pin M11 formed in the metal layer M1 may include a segment M11_1 extending in the Y-axis direction. As a result, a region in which a via is placed in the input pin M11 is expanded. The increased degree of freedom in placing a via may decrease routing congestion during a routing process following the placement of the standard cell 60. As a result, an integrated circuit including a plurality of standard cells and interconnections has improved performance and an increased degree of integration due to a simple structure.

Figure 7:
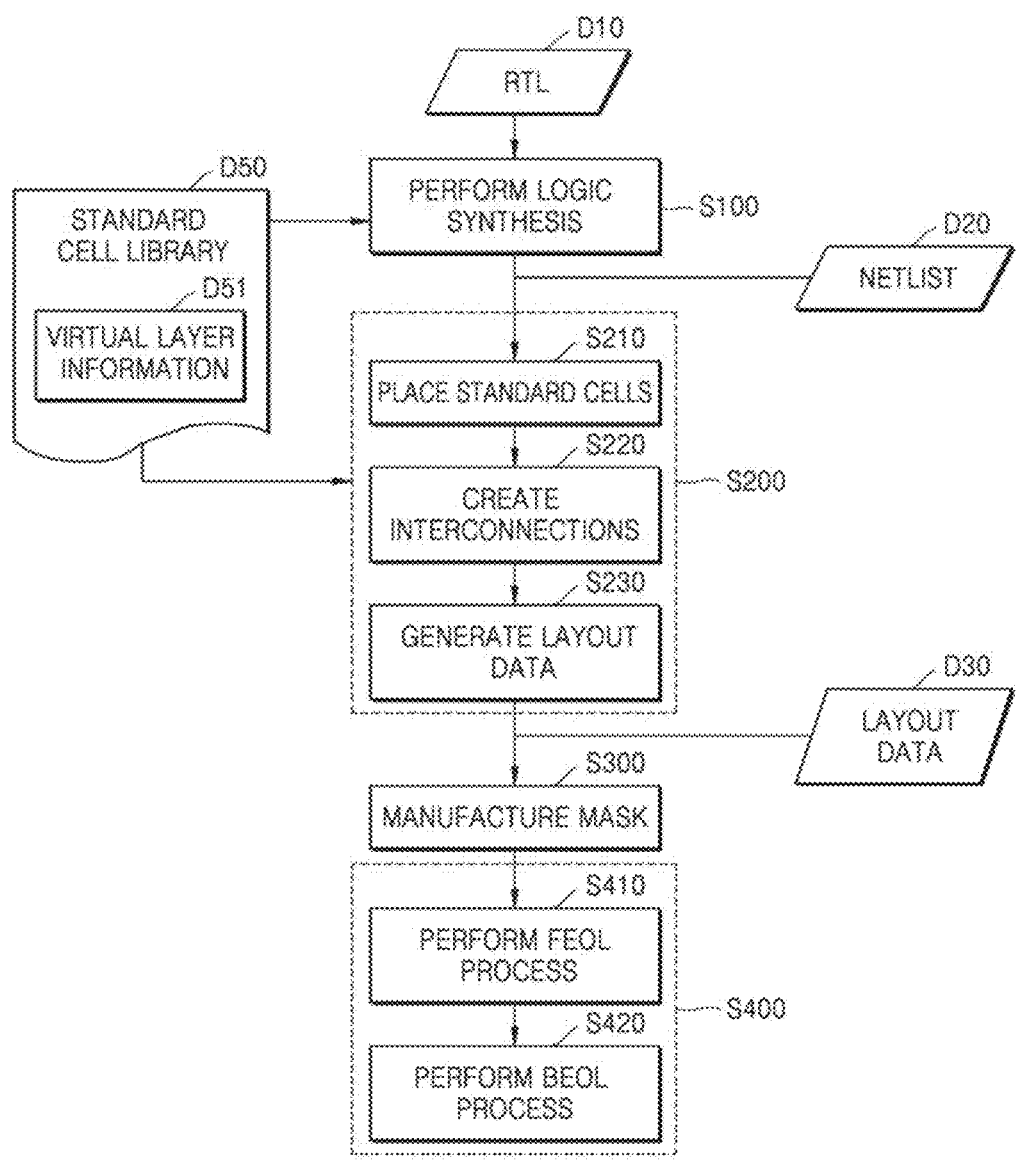
FIG. 7 is a flowchart of a method of fabricating an integrated circuit including a plurality of standard cells, according to an exemplary embodiment.

FIG. 7 is a flowchart of a method of fabricating an integrated circuit including a plurality of standard cells, according to an exemplary embodiment.

A standard cell library D50 may include information about the plurality of standard cells, e.g., at least one of function information, characteristic information, and layout information. As shown in FIG. 7, the standard cell library D50 may include virtual layer information D51.

The virtual layer information D51 may define a virtual layer for limiting the placement of a via at an output pin of a standard cell. The virtual layer may not actually be included in the integrated circuit, but may be used during the designing of the integrated circuit. The pattern of the virtual layer defined by the virtual layer information D51 may indicate a region in which placement of a via is forbidden, such that a via may be placed on the output pin in a region not having the pattern of the virtual layer. Alternatively, the pattern of the virtual layer defined by the virtual layer information D51 may indicate a region in which placement of a via is permitted, such that a via may be placed on the output pin in a region having the pattern of the virtual layer. The virtual layer will be described in detail below with reference to FIGS. 8A and 8B.

When the pattern of a virtual layer is defined by the virtual layer information D51 so that a via is placed on a third segment of an output pin of a standard cell, as described above, a path of a current flowing from current supply points to the via may not overlap with a path of a current flowing from the via to current draw points in the output pin. As a result, the output pin may prevent and/or mitigate EM and may have a reduced area.

Referring to FIG. 7, logic synthesis may be performed to generate netlist data D20 from register transfer level (RTL) data D10 in operation S100. For example, a semiconductor design tool (e.g., a logic synthesis tool) may perform logic synthesis based on the RTL data D10 written in hardware description languages (HDLs), such as very high speed integrated circuit (VHSIC) HDL (VHDL) and Verilog, referring to the standard cell library D50, thereby generating the netlist data D20 including a bitstream or a netlist. As described above, information about standard cells that prevent and/or mitigate EM and have improved performance and/or or reduced areas may be included in the standard cell library D50 and such standard cells may be included in an integrated circuit during logic synthesis.

As described above with reference to FIGS. 5A through 5E, when the area of an output pin of a standard cell is reduced, the capacitance of the output pin may be decreased. The decreased capacitance of the output pin may lead to improvement in a response characteristic of an output signal output through the output pin and, therefore, a timing characteristic of the standard cell may be improved. The improved timing characteristic of the standard cell may be referred to during the logic synthesis in operation S100.

Placement and routing (P&R) may be performed to generate layout data D30 from the netlist data D20 in operation S200. As shown in FIG. 7, P&R may include a plurality of operations S210, S220, and S230.

Standard cells may be placed in operation S210. For example, a semiconductor design tool (e.g., a P&R tool) may place a plurality of standard cells based on the netlist data D20, referring to the standard cell library D50. As described above, the standard cells may have a predetermined height and, therefore, the semiconductor design tool may place the standard cells to have the predetermined length on a crossing grid.

Interconnections may be created in operation S220. An interconnection may electrically connect an output pin with an input pin in a standard cell and may include, for example, at least one via and at least one conductive pattern. The standard cells may be routed by creating the interconnections. A via included in an output pin of each standard cell among vias included in an interconnection may be placed in a limited region according to the pattern of a virtual layer defined by the virtual layer information D51 included in the standard cell library D50. Operation S220 will be described in detail below with reference to FIGS. 9 and 11.

The layout data D30 may be generated in operation S230. The layout data D30 may have a format, e.g., Graphic Database System II (GDSII), and may include geometric information of standard cells and interconnections.

A mask may be manufactured in operation S300. For example, patterns formed on a plurality of layers may be defined by the layout data D30 and at least one mask (or photomask) for forming the patterns of the layers may be manufactured or provided.

An integrated circuit may be fabricated in operation S400. For example, the integrated circuit may be fabricated by patterning the layers using the at least one mask manufactured in operation S300. As shown in FIG. 7, operation S400 may include operations S410 and S420.

A front-end-of-line (FEOL) process may be performed in operation S410. FEOL may refer to a process of forming individual elements, e.g., a transistor, a capacitor, and a resistor, on a substrate during the fabrication of the integrated circuit. For example, FEOL may include at least one of wafer planarization and cleaning, formation of a trench, formation of a well, formation of a gate line, and formation of a source and a drain.

A back-end-of-line (BEOL) process may be performed in operation S420. BEOL may refer to a process of interconnecting individual elements, e.g., a transistor, a capacitor, and a resistor, during the fabrication of the integrated circuit. For example, BEOL may include at least one of silicidation of gate, source and drain regions, addition of a dielectric, planarization, formation of a hole, addition of a metal layer, formation of a via, and formation of a passivation layer. Thereafter, the integrated circuit may be packaged into a semiconductor package and used as a component of various applications.

A conductive pattern according to one or more exemplary embodiments and a via electrically connected to the conductive pattern may be formed by performing the BEOL process in operation S420. For example, the layout data D30 may include geometric information of an output pin of a standard cell defined by the standard cell library D50 and the output pin may be formed using the BEOL process that uses a mask manufactured according to the layout data D30. In addition, the layout data D30 may include geometric information of a via, which is placed at a limited region in the output pin of the standard cell according to the virtual layer information D51. The via may be formed using the BEOL process using the mask manufactured according to the layout data D30.

Figure 8A:
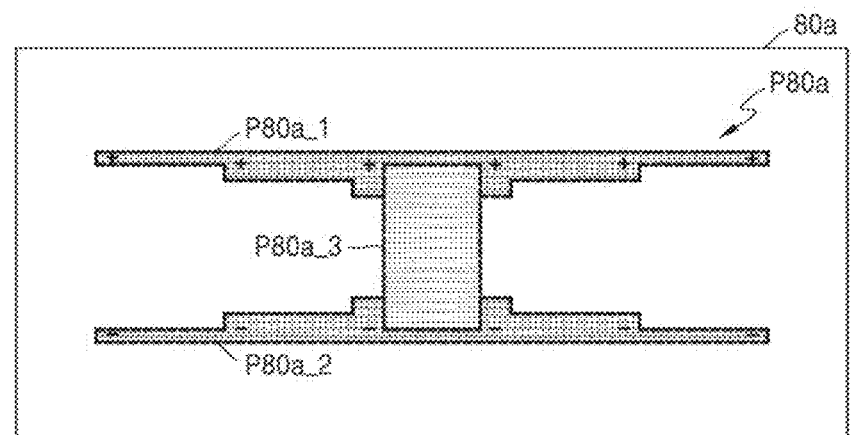
FIGS. 8A and 8B are diagrams of virtual layers defined by virtual layer information shown in FIG. 7, according to one or more exemplary embodiments.
Figure 8A:
Figure 8B:
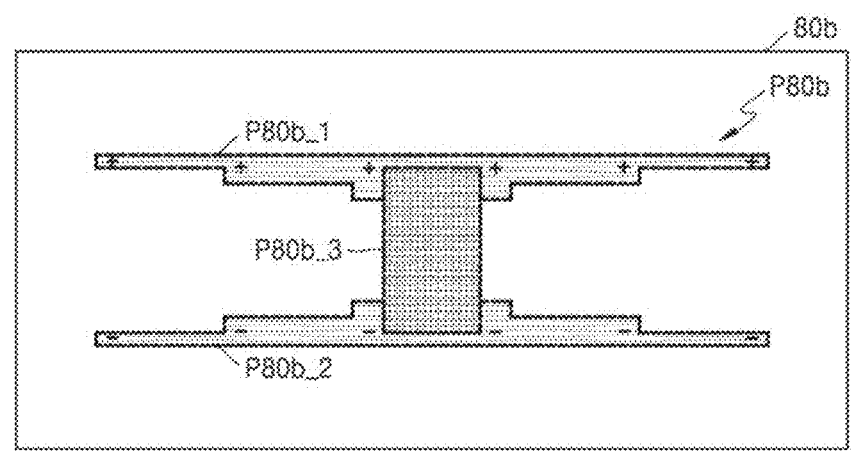
Figure 8B:

FIGS. 8A and 8B are diagrams of virtual layers defined by the virtual layer information D51 shown in FIG. 7, according to one or more exemplary embodiments. As described above with reference to FIG. 7, the virtual layer information D51 may be included in the standard cell library D50 and may define a virtual layer for limiting placement of a via in an output pin of a standard cell. The virtual layer may not be actually included in an integrated circuit but may be used only during the designing of the integrated circuit.

Referring to FIG. 8A, a pattern of a virtual layer defined by the virtual layer information D51 may indicate a region in which placement of a via is forbidden. For example, as shown in FIG. 8A, an output pin P80a of a standard cell 80a may include a first segment P80a_1 including current supply points and extending in the X-axis direction, a second segment P80a_2 including current draw points and extending in the X-axis direction, and a third segment P80a_3 connecting the first segment P80a_1 to the second segment P80a_2. A via may be placed on the third segment P80a_3. Accordingly, the virtual layer may include a pattern corresponding to a region in which placement of a via is forbidden, i.e., the first segment P80a_1 and the second segment P80a_2 of the output pin P80a. The virtual layer including the pattern corresponding to the region in which placement of a via is forbidden may be referred to as an obstacle (OBS) layer or an OBS marking layer. When the interconnections are created in operation S220 shown in FIG. 7, a semiconductor design tool may recognize the pattern of the OBS layer and may place a via in a region other than the pattern of the OBS layer, thereby creating an interconnection.

Referring to FIG. 8B, a pattern of a virtual layer defined by the virtual layer information D51 may indicate a region in which placement of a via is permitted. For example, as shown in FIG. 8B, an output pin P80b of a standard cell 80b may include a first segment P80b_1 including current supply points and extending in the X-axis direction, a second segment P80b_2 including current draw points and extending in the X-axis direction, and a third segment P80b_3 connecting the first segment P80b_1 to the second segment P80b_2. A via may be placed on the third segment P80b_3. Accordingly, the virtual layer may include a pattern corresponding to a region in which placement of a via is permitted, i.e., the third segment P80b_3 of the output pin P80b. The virtual layer including the pattern corresponding to the region in which placement of a via is permitted may be referred to as a pin layer or a pin marking layer. When the interconnections are created in operation S220 shown in FIG. 7, a semiconductor design tool may recognize the pattern of the pin layer and may place a via in a region in which the pattern of the pin layer exists, thereby creating an interconnection.

Figure 9:
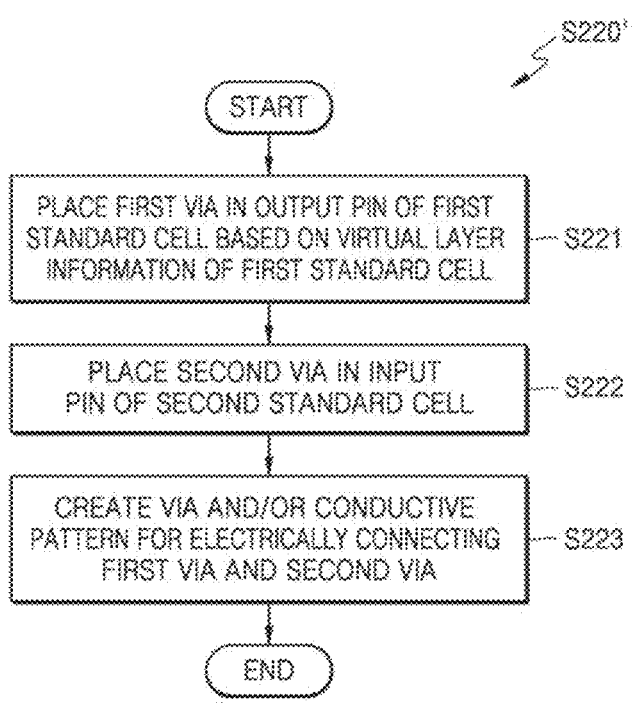
FIG. 9 is a flowchart of an example of operation S220 shown in FIG. 7, according to an exemplary embodiment.

FIG. 9 is a flowchart of an example of operation S220 shown in FIG. 7, according to an exemplary embodiment. In detail, FIG. 9 is a flowchart of a method S220' of creating an interconnection for electrically connecting an output pin of a first standard cell with an input pin of a second standard cell. As described above with reference to FIG. 7, the interconnections may be created in operation S220' after the standard cells are placed. As shown in FIG. 9, operation S220' may include operations S221, S222, and S223 and will be described together with reference to FIG. 7.

A first via may be placed in the output pin of the first standard cell based on virtual layer information of the first standard cell in operation S221. As described above, the virtual layer information may define a region in which placement of the first via is forbidden or permitted in the output pin of the first standard cell so that the first via placed in the output pin of the first standard cell is between current supply points and current draw points. Accordingly, the first via may be placed on the output pin of the first standard cell so that a path of a current flowing from the current supply points to the first via does not overlap with a path of a current flowing from the first via to the current draw points.

A second via may be placed in the input pin of the second standard cell in operation S222. As described above with reference to FIGS. 5A through 5E, when an output pin of the second standard cell has a stair shape, a space for the input pin of the second standard cell may be additionally secured and, therefore, an area in which the second via can be placed in the input pin of the second standard cell may be increased. The increased degree of freedom in placing the second via may lead to an increase in the degree of freedom of an interconnection electrically connecting the output pin of the first standard cell with the input pin of the second standard cell. As a result, routing congestion is improved in an integrated circuit including a plurality of standard cells and, therefore, the performance and/or the degree of integration of the integrated circuit is increased.

A via and/or a conductive pattern for electrically connecting the first via and the second via may be created in operation S223. For example, a first conductive pattern and a second conductive pattern may be created to be electrically connected with the first via and respectively formed on a first upper conductive layer and a second upper conductive layer of the output pin of the first standard cell and a via may be created to electrically connect the first conductive pattern and the second conductive pattern.

Operations S221, S222, and S223 may be performed in different orders than shown in FIG. 9. In other words, the first via and the second via and the first conductive pattern and the second conductive pattern, which are included in an interconnection for electrically connecting the output pin of the first standard cell with the input pin of the second standard cell, may be created in random order.

Figure 10A:
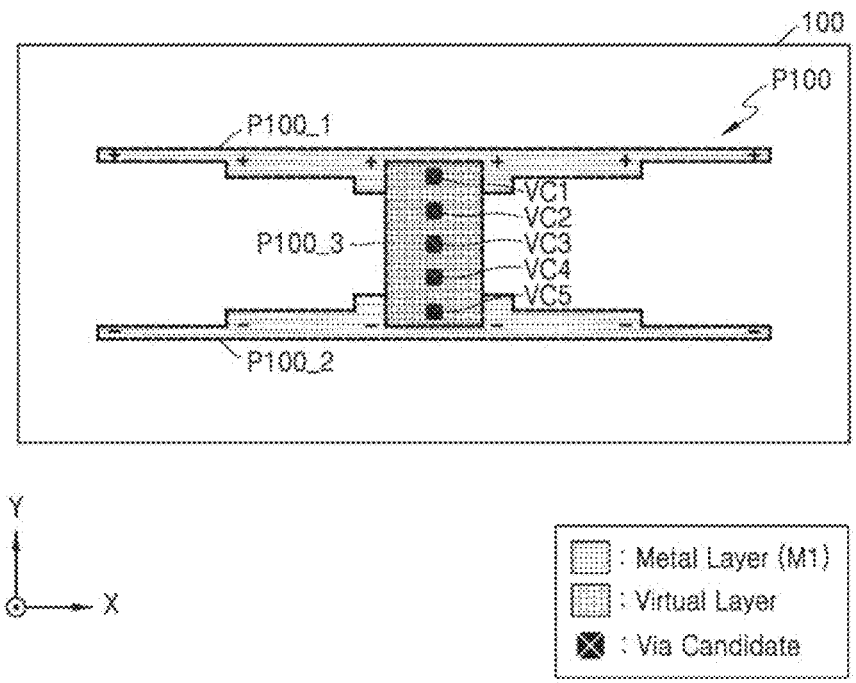
FIG. 10A is a diagram of a virtual layer defined by the virtual layer information shown in FIG. 7, according to an exemplary embodiment.
Figure 10B:
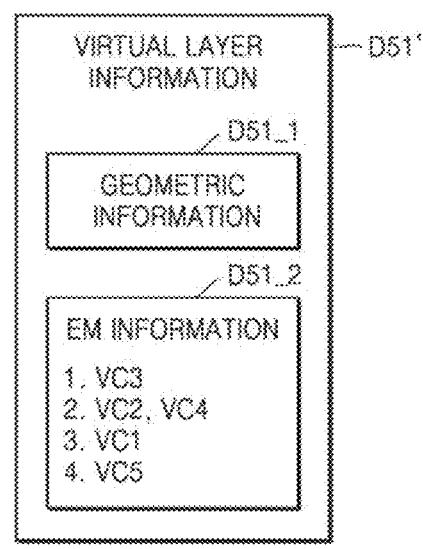
FIG. 10B is a diagram of an example of the virtual layer information shown in FIG. 7, according to an exemplary embodiment.

FIG. 10A is a diagram of a virtual layer defined by the virtual layer information D51 shown in FIG. 7, according to an exemplary embodiment. FIG. 10B is a diagram of an example of the virtual layer information D51 shown in FIG. 7, according to an exemplary embodiment. Similarly to exemplary embodiments described above with reference to FIG. 8B, the virtual layer is a pin layer and may include a pattern corresponding to a region in which placement of a via is permitted in the exemplary embodiment illustrated in FIG. 10A. Virtual layer information D51' shown in FIG. 10B may include geometric information D51_1 defining the pattern of the pin layer.

Referring to FIG. 10A, an output pin P100 of a standard cell 100 may include a first segment P100_1 including current supply points and extending in the X-axis direction, a second segment P100_2 including current draw points and extending in the X-axis direction, and a third segment P100_3 connecting the first segment P100_1 to the second segment P100_2. The pattern of the virtual layer may correspond to the third segment P100_3. A via may be placed at one of positions predetermined on a grid according to a semiconductor design standard, e.g., a design rule. Accordingly, as shown in FIG. 10A, a via may be placed at one of five positions in the third segment P100_3. The pattern of the virtual layer may define via candidates VC1 through VC5 respectively corresponding to positions at which a via can be placed.

Referring to FIG. 10B, the virtual layer information D51' may include the geometric information D51_1 and EM information D51_2. The geometric information D51_1 may define the pattern of the virtual layer corresponding to the third segment P100_3 shown in FIG. 10A. The EM information D51_2 may set priorities on the via candidates VC1 through VC5. As described above with reference to FIG. 3, the effect of EM may vary with the position of a via. Even in the third segment P100_3, the EM effect may vary with the position of a via. Accordingly, the EM information D51_2 may set priorities on positions at which a via can be placed in a region defined by the geometric information D51_1 so that the less the EM effect, the higher the priority of a position. For example, as shown in FIGS. 10A and 10B, the EM information D51_2 may set priorities on the five via candidates VC1 through VC5 in an order like the third via candidate VC3, the second via candidate VC2, the first via candidate VC1, and the fifth via candidate VC5 and may set the fourth via candidate VC4 to have the same priority as the second via candidate VC2. When the interconnections are created in operation S220 shown in FIG. 7, the EM information D51_2 of the virtual layer information D51' may be referred to and a via may be placed preferentially at a position corresponding to a via candidate having a higher priority. A method of creating an interconnection referring to the priority order of via candidates will be described below in detail with reference to FIG. 11.

Figure 11:
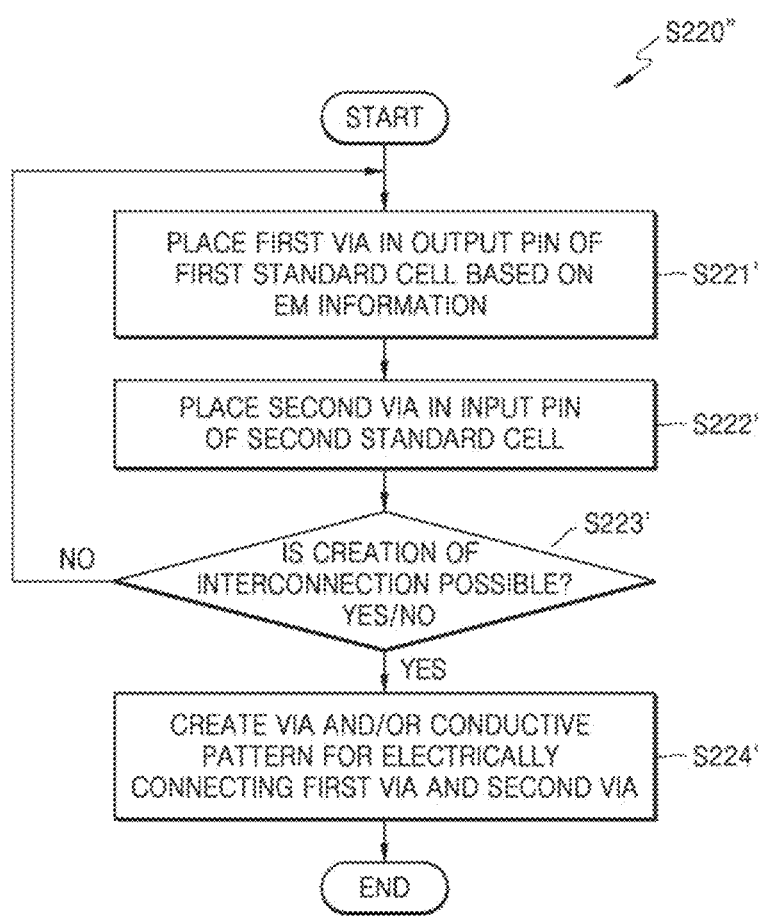
FIG. 11 is a flowchart of another example of operation S220 shown in FIG. 7, according to an exemplary embodiment.

FIG. 11 is a flowchart of another example of operation S220 shown in FIG. 7, according to an exemplary embodiment. In detail, FIG. 11 shows a method S220" of creating an interconnection for electrically connecting the output pin of the first standard cell with the input pin of the second standard cell, referring to the virtual layer information D51' shown in FIG. 10B. As shown in FIG. 11, operation S220" may include a plurality of operations S221', S222', S223', and S224' and will be described with reference to FIGS. 10A and 10B together.

A first via may be placed in the output pin of the first standard cell based on EM information in operation S221'. As described above with reference to FIGS. 10A and 10B, the EM information may set priorities on positions at which a via can be placed so that the less the EM effect, the higher the priority of a position. The via may be placed at a position having the highest priority in operation S221'.

A second via may be placed in the input pin of the second standard cell in operation S222'. As described above with reference to FIGS. 5A through 5E, when an output pin of the second standard cell has a stair shape, a space for the input pin of the second standard cell may be additionally secured and, therefore, an area in which the second via can be placed in the input pin of the second standard cell may be increased.

Whether creation of an interconnection is possible may be determined in operation S223'. For example, creation of an interconnection which includes the first via and the second via and a conductive pattern electrically connecting the first via and the second via may be impossible due to other interconnections for electrically connecting other standard cells in an integrated circuit, design rules, and so on. When creation of a conductive pattern is impossible, the first via may be placed in the output pin of the first standard cell based on the EM information in operation S221' at present. At this time, the first via may be placed at a position having lower priority than a position chosen in operation S221' that has been performed before. When creation of a conductive pattern is possible, a via and/or a conductive pattern for electrically connecting the first via and the second via may be created in operation S224'.

Operations S221', S222', and S223' may be performed in different orders than shown in FIG. 11. For example, after the first via is placed in operation S221', whether creation of an interconnection including the first via is possible may be determined in operation S222'. According to another exemplary embodiment, it may first be determined whether creation of an interconnection for connecting the output pin of the first standard cell with the input pin of the second standard cell is possible in operation S223' to determine a path of the creatable interconnection. Thereafter, the first via and the second via may be placed in operations S221' and S222'.

Figure 12:
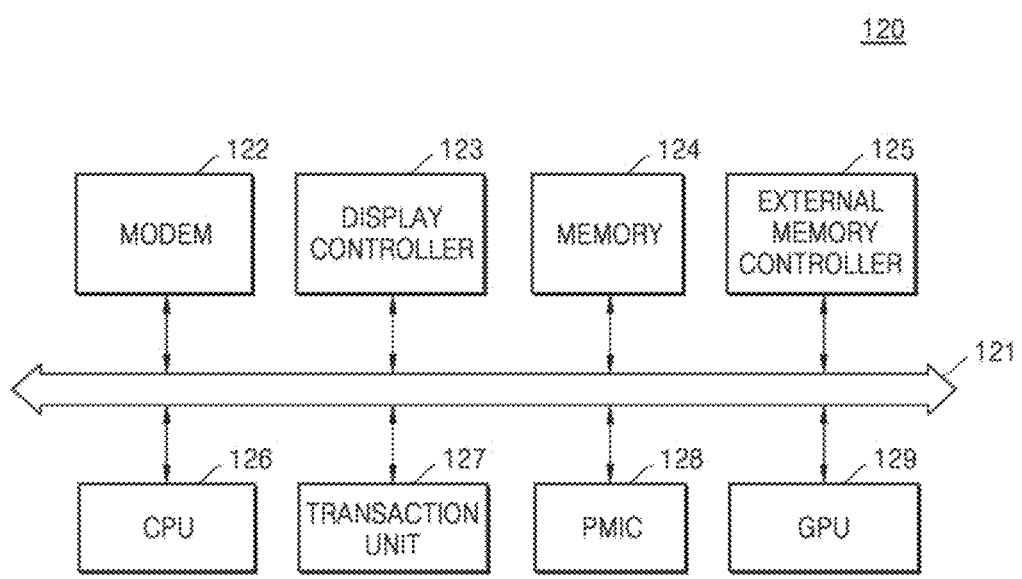
FIG. 12 is a block diagram of a system-on-chip (SoC) according to an exemplary embodiment.

FIG. 12 is a block diagram of a system-on-chip (SoC) 120 according to an exemplary embodiment. The SoC 120 may be a semiconductor device and may include an integrated circuit according to an exemplary embodiment. The SoC 120 is implemented by integrating complex functional blocks, such as intellectual properties (IPs) performing various functions, into a single chip. According to an exemplary embodiment, a standard cell may be included in each of the functional blocks of the SoC 120 and, therefore, EM is prevented and/or mitigated and the SoC 120 has a reduced area and high reliability.

Referring to FIG. 12, the SoC 120 may include a modem 122, a display controller 123, a memory 124, an external memory controller 125, a central processing unit (CPU) 126, a transaction unit 127, a power management integrated circuit (PMIC) 128, and a graphics processing unit (GPU) 129. The functional blocks of the SoC 120 may communicate with one another through a system bus 121.

The CPU 126, which may control all or some operations of the SoC 120, may control operations of other functional blocks including the modem 122, the display controller 123, the memory 124, the external memory controller 125, the CPU 126, the transaction unit 127, the PMIC 128, and the GPU 129. The modem 122 may demodulate a signal received from outside the SoC 120 or may modulate a signal generated in the SoC 120 and transmit the signal to outside of the SoC 120. The external memory controller 125 may control operations of transmitting and receiving data to and from an external memory device connected to the SoC 120. For example, programs and/or data stored in the external memory device may be provided to the CPU 126 or the GPU 129 under the control of the external memory controller 125. The GPU 129 may execute program instructions involved in graphics processing. The GPU 129 may receive graphic data through the external memory controller 125 and may transmit processed graphic data to outside of the SoC 120 through the external memory controller 125. The transaction unit 127 may monitor a data transaction of each functional block. The PMIC 128 may control power supplied to each functional block according to the control of the transaction unit 127. The display controller 123 may control a display (or a display device) outside the SoC 120 and transmit data generated in the SoC 120 to the display.

The memory 124 may be non-volatile memory, such as electrically erasable programmable read-only memory (EEPROM), flash memory, phase-change random access memory (PRAM), resistance RAM (RRAM), nano floating gate memory (NFGM), polymer RAM (PoRAM), magnetic RAM (MRAM), or ferroelectric RAM (FRAM), or may be volatile memory, such as dynamic RAM (DRAM), static RAM (SRAM), mobile DRAM, double data rate (DDR) synchronous DRAM (SDRAM), low power DDR (LPDDR) SDRAM, graphics DDR (GDDR) SDRAM, or Rambus DRAM (RDRAM).

Figure 13:
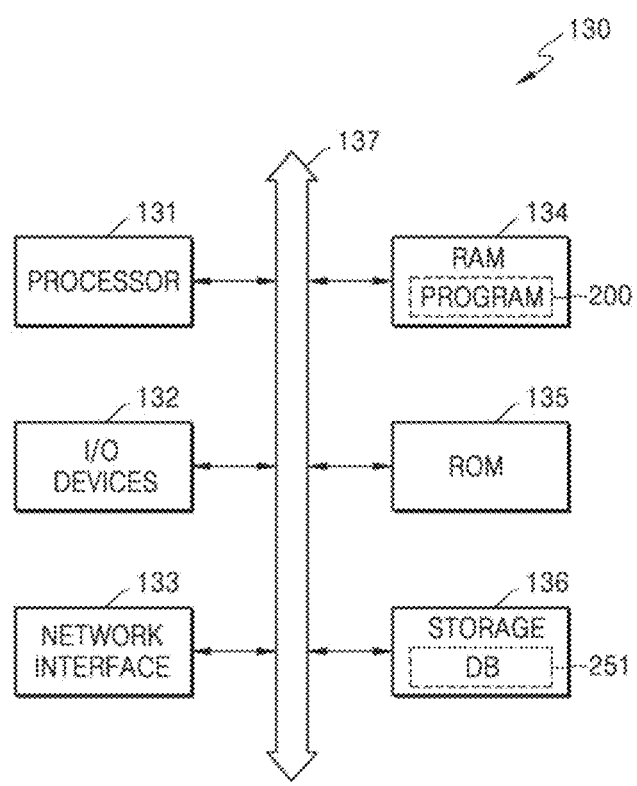
FIG. 13 is a block diagram of a computing system including a memory storing a program, according to an exemplary embodiment.

FIG. 13 is a block diagram of a computing system 130 including a memory storing a program, according to an exemplary embodiment. At least some of operations included in a method of fabricating an integrated circuit (e.g., the method shown in FIG. 7) according to an exemplary embodiment may be performed in the computing system 130.

The computing system 130 may be a stationary computing system such as a desktop computer, a workstation, or a server, or may be a portable computing system such as a laptop computer. As shown in FIG. 13, the computing system 130 may include a processor 131, input/output (I/O) devices 132, a network interface 133, RAM 134, ROM 135, and a storage 136. The processor 131, the I/O devices 132, the network interface 133, the RAM 124, the ROM 135, and the storage 136 may be connected to a bus 137 and may communicate with one another through the bus 137.

The processor 131 may be referred to as a processing unit and may include at least one core, which may execute an instruction set (e.g., Intel Architecture-32 (IA-32), 64-bit extension IA-32, x86-64, PowerPC, Sparc, microprocessor without interlocked pipeline stage (MIPS), advanced recued instruction set computer (RISC) machine (ARM), or IA-64), like a microprocessor, an application processor (AP), a digital signal processor (DSP), or a GPU. For example, the processor 131 may access memory, i.e., the RAM 134 or the ROM 135, through the bus 137 and may execute instructions stored in the RAM 134 or the ROM 135. As shown in FIG. 13, the RAM 134 may store a program 200 according to an exemplary embodiment or at least part of the program 200. The program 200 may enable the processor 131 to perform at least some operations included in a method of fabricating an integrated circuit. In other words, the program 200 may include a plurality of instructions that can be executed by the processor 131. The instructions included in the program 200 may enable the processor 131 to perform, for example, logic synthesis in operation S100 and/or P&R in operation S200 shown in FIG. 7.

The storage 136 may not lose data stored therein even when power supplied to the computing system 130 is cut off. The storage 136 may include a non-volatile memory device or a storage medium such as a magnetic tape, an optical disc, or a magnetic disc. The storage 136 may be removable from the computing system 130. The storage 136 may store the program 200 according to an exemplary embodiment. Before being executed by the processor 131, the program 200 or at least part of the program 200 may be loaded from the storage 136 to the RAM 134. Alternatively, the storage 136 may store a file written in program language, and the program 200 generated by a compiler from the file or at least part of the program 200 may be loaded to the RAM 134. The storage 136 may also store a database (DB) 251. The DB 251 may include information, e.g., the standard cell library D50 shown in FIG. 7, used to design an integrated circuit.

The storage 136 may also store data to be processed by the processor 131 or data that has been processed by the processor 131. In other words, the processor 131 may generate data by processing data stored in the storage 136 or may store generated data in the storage 136 according to the program 200. For example, the storage 136 may store the RTL data D10, the net list data D20, and/or the layout data D30.

The I/O devices 132 may include an input device such as a keyboard or a pointing device and an output device such as a display device or a printer. For example, a user may trigger the execution of the program 200 by the processor 131, input the RTL data D10 and/or the net list data D20 shown in FIG. 7, and check the layout data D30 shown in FIG. 7, through the I/O devices 132.

The network interface 133 may provide an access to a network outside the computing system 130. For example, the network may include a plurality of computing systems and communication links. The communication links may include wired links, optical links, wireless links, or other types of links.

While exemplary embodiments have been particularly shown and described above, it will be understood that various changes in form and details may be made therein without departing from the spirit and scope of the following claims.

What is claimed is:

1. An integrated circuit comprising:
    a first conductive pattern in a conductive layer, the first conductive pattern comprising:
        a first segment extending in a first direction,
        a second segment extending in the first direction, and
        a third segment extending in a second direction to connect the first segment and the second segment;
    a second conductive pattern in the conductive layer between the first segment and the second segment;
    at least one gate line extending in the second direction; and
    at least one gate contact electrically connected to the at least one gate line,
    wherein a width of the third segment is greater than both a width of the first segment and a width of the second segment,
    wherein the first conductive pattern is an output pin of a standard cell, and
    wherein the second conductive pattern is an input pin of the standard cell.

2. The integrated circuit of claim 1, further comprising:
    a plurality of first fins extending in the first direction on a first active region;
    at least one first active contact electrically connected to the plurality of the first fins;
    a plurality of second fins extending in the first direction on a second active region; and
    at least one second active contact electrically connected to the plurality of the second fins.

3. The integrated circuit of claim 2, further comprising:
    at least one first via between the at least one first active contact and a bottom of the first segment;
    at least one second via between the at least one second active contact and a bottom of the second segment; and
    at least one third via on a top of the third segment.

4. The integrated circuit of claim 3,
    wherein the first segment is electrically connected only to the at least one first via and the third segment, and
    wherein the second segment is electrically connected only to the at least one second via and the third segment.

5. The integrated circuit of claim 1,
    wherein the standard cell is an inverter.

6. The integrated circuit of claim 1, further comprising:
    a third conductive pattern in the conductive layer; and
    a fourth conductive pattern in the conductive layer,
    wherein the third conductive pattern extends in the first direction and is configured to receive a power supply voltage, and
    wherein the fourth conductive pattern extends in the first direction and is configured to receive a ground voltage.

7. The integrated circuit of claim 1,
    wherein the first segment extends in the first direction between two ends,
    wherein the second segment extends in the first direction between two ends, and
    wherein the third segment is connected to one of the two ends of the first segment and one of the two ends of the second segment.

8. The integrated circuit of claim 1,
    wherein the first segment extends in the first direction between two ends,
    wherein the second segment extends in the first direction between two ends, and
    wherein the third segment is connected to the first segment between the two ends of the first segment and to the second segment between the two ends of the second segment.

9. The integrated circuit of claim 1,
    wherein a distance between the third segment and one end of the first segment is different from a distance between the third segment and the other end of the first segment, and
    wherein a distance between the third segment and one end of the second segment is different from a distance between the third segment and the other end of the second segment.

10. The integrated circuit of claim 1,
    wherein the first segment has a stair shape of which the width of the first segment decreases away from the third segment in the first direction.

11. The integrated circuit of claim 10,
    wherein the first segment has the stair shape at a first side facing the second segment and a flat shape at a second side opposite to the first side.

12. The integrated circuit of claim 10,
    wherein the first segment has the stair shape at each of two sides facing in the second direction.

13. The integrated circuit of claim 10,
    wherein the second segment has a stair shape of which the width of the second segment decreases away from the third segment in the first direction.

14. The integrated circuit of claim 10,
    wherein the second conductive pattern is near a portion of the first segment having shorter width.

15. The integrated circuit of claim 14,
    wherein the second segment has a stair shape of which the width of the second segment decreases away from the third segment.

16. An integrated circuit comprising:
    a standard cell, the standard cell comprising:
        a plurality of first fins extending in a first direction on a first active region,
        a plurality of second fins extending in the first direction on a second active region,
        a first pattern configured to receive a power supply voltage in a conductive layer,
        a second pattern configured to receive a ground voltage in the conductive layer, and
        an output pin disposed between the first pattern and the second pattern in the conductive layer,
    wherein the output pin comprises:
        a first segment and a second segment extending in the first direction to be parallel each other, and
        a third segment extending in a second direction and connecting the first segment and the second segment,
    wherein at least one of the first segment and the second segment has a shape of which a width decreases away from the third segment in the first direction.

17. The integrated circuit of claim 16,
wherein the standard cell further comprises an input pin in the conductive layer, and
wherein the input pin is disposed near a portion having a decreased width of the first segment and/or a portion having a decreased width of the second segment.

18. The integrated circuit of claim 17,
wherein the input pin has a shape of which a width increases away from the third segment in the first direction.

* * * * *